United States Patent
Chen et al.

(10) Patent No.: US 9,741,966 B2
(45) Date of Patent: Aug. 22, 2017

(54) METHOD FOR HYBRID ENCAPSULATION OF AN ORGANIC LIGHT EMITTING DIODE

(71) Applicant: Applied Materials, Inc., Santa Clara, CA (US)

(72) Inventors: Jrjyan Jerry Chen, Campbell, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/192,383

(22) Filed: Jun. 24, 2016

(65) Prior Publication Data
US 2016/0308166 A1   Oct. 20, 2016

Related U.S. Application Data (63) Continuation of application No. 13/787,550, filed on Mar. 6, 2013, now Pat. No. 9,397,318.
(Continued)

(51) Int. Cl.
  *H01L 51/56* (2006.01)
  *H01L 51/52* (2006.01)

(52) U.S. Cl.
  CPC .......... *H01L 51/5253* (2013.01); *H01L 51/56* (2013.01)

(58) Field of Classification Search
  None
  See application file for complete search history.

(56) References Cited

U.S. PATENT DOCUMENTS 6,458,720 B1 * 10/2002 Aoi .................. H01L 21/02126
                                                       257/E21.261
7,074,501 B2   7/2006 Czeremuszkin et al.
(Continued)

FOREIGN PATENT DOCUMENTS

CN   101106178 A   1/2008
CN   101512728 A   8/2009
(Continued)

OTHER PUBLICATIONS

Chinese Office Action (with attached English translation) for Application No. 201380044659.0; dated Apr. 15, 2016; 13 total pages.
(Continued)

*Primary Examiner* — Calvin Choi
*Assistant Examiner* — Xiaoming Liu
(74) *Attorney, Agent, or Firm* — Patterson + Sheridan, LLP (57) ABSTRACT

Methods and apparatus for encapsulating organic light emitting diode (OLED) structures disposed on a substrate using a hybrid layer of material are provided. The encapsulation methods may be performed as single or multiple chamber processes. The processing parameters used during deposition of the hybrid layer of material allow control of the characteristics of the deposited hybrid layer. The hybrid layer may be deposited such that the layer has characteristics of an inorganic material in some sublayers of the hybrid layer and characteristics of an organic material in other sublayers of the hybrid layer. Use of the hybrid material allows OLED encapsulation using a single hard mask for the complete encapsulating process with low cost and without alignment issues present in conventional processes.

16 Claims, 8 Drawing Sheets

Related U.S. Application Data (60) Provisional application No. 61/696,700, filed on Sep. 4, 2012.

(56) References Cited

U.S. PATENT DOCUMENTS

| | | | |
|---|---|---|---|
| 7,183,197 | B2 | 2/2007 | Won et al. |
| 7,214,600 | B2 | 5/2007 | Won et al. |
| 7,220,687 | B2 | 5/2007 | Won |
| 7,518,142 | B2 | 4/2009 | Hoffmann et al. |
| 7,811,669 | B2 * | 10/2010 | Fujii .................. C23C 14/0021 427/255.18 |
| 7,951,620 | B2 | 5/2011 | Won et al. |
| 9,397,318 | B2 * | 7/2016 | Chen .................. H01L 51/5253 |
| 2001/0051445 | A1 * | 12/2001 | Shioya .................. C23C 16/30 438/778 |
| 2003/0162033 | A1 | 8/2003 | Johnson et al. |
| 2004/0229051 | A1 * | 11/2004 | Schaepkens .......... C23C 14/022 428/447 |
| 2006/0078677 | A1 | 4/2006 | Won et al. |
| 2006/0246811 | A1 | 11/2006 | Winters et al. |
| 2007/0048992 | A1 | 3/2007 | Hosokawa et al. |
| 2007/0290201 | A1 | 12/2007 | Hoffmann et al. |
| 2008/0315188 | A1 | 12/2008 | Hwang et al. |
| 2010/0285319 | A1 | 11/2010 | Kwak et al. |
| 2011/0068332 | A1 | 3/2011 | Han et al. |
| 2011/0140163 | A1 * | 6/2011 | Oh ..................... H01L 51/5256 257/100 |
| 2011/0198620 | A1 | 8/2011 | Han et al. |
| 2012/0098146 | A1 * | 4/2012 | Lee ..................... C23C 16/042 257/787 |
| 2012/0199872 | A1 | 8/2012 | Chen et al. |
| 2012/0258294 | A1 | 10/2012 | Leyder et al. |
| 2012/0258295 | A1 | 10/2012 | Leyder et al. |
| 2012/0292084 | A1 | 11/2012 | Lai et al. |

FOREIGN PATENT DOCUMENTS

| | | |
|---|---|---|
| KR | 1020110000818 | 1/2011 |
| KR | 101560234 B1 | 10/2015 |
| TW | I354032 B | 12/2011 |
| TW | 201236231 A | 9/2012 |
| WO | 2008/078346 A1 | 7/2008 |

OTHER PUBLICATIONS

Chinese Office Action dated Jun. 2, 2015 for Application No. 201280007857.5.

International Search Report dated Nov. 13, 2013 for PCT/US13/53743.

Office Action for U.S. Appl. No. 13/787,550 dated Jan. 16, 2015.

Final Office Action for U.S. Appl. No. 13/787,550 dated May 8, 2015.

Office Action for U.S. Appl. No. 13/787,550 dated Nov. 20, 2015.

Taiwan Office Action dated Nov. 23, 2016 for Application No. 102128502.

Chinese Office Action (with attached English translation) for Application No. 201380044659.0; dated Oct. 17, 2016; 10 total pages.

Taiwan Office Action dated Feb. 24, 2017 for Application No. 102128502.

* cited by examiner

METHOD FOR HYBRID ENCAPSULATION OF AN ORGANIC LIGHT EMITTING DIODE

CROSS-REFERENCE TO RELATED APPLICATIONS

This application is a continuation of U.S. patent application Ser. No. 13/787,550, filed Mar. 6, 2013, which claims benefit of U.S. Provisional Patent Application No. 61/696,700, filed Sep. 4, 2012, both of which are herein incorporated by reference in their entirety.

BACKGROUND

Field

Embodiments of the invention generally relate to a method and apparatus for encapsulating an organic light emitting diode.

Description of the Related Art

Organic light emitting diode (OLED) displays have gained significant interest recently in display applications due to their faster response time, larger viewing angles, higher contrast, lighter weight, low power and amenability to flexible substrates such as compared to liquid crystal displays (LCD). However, OLED structures may have a limited lifetime, characterized by a decrease in electroluminescence efficiency and an increase in drive voltage. A main reason for the degradation of OLED structures is the formation of non-emissive dark spots due to moisture or oxygen ingress. For this reason, OLED structures are typically encapsulated by an organic layer sandwiched between inorganic layers. The organic layer is utilized to fill any voids or defects in the first inorganic layer such that the second inorganic layer has a substantially uniform surface or deposition.

Figure 1A:
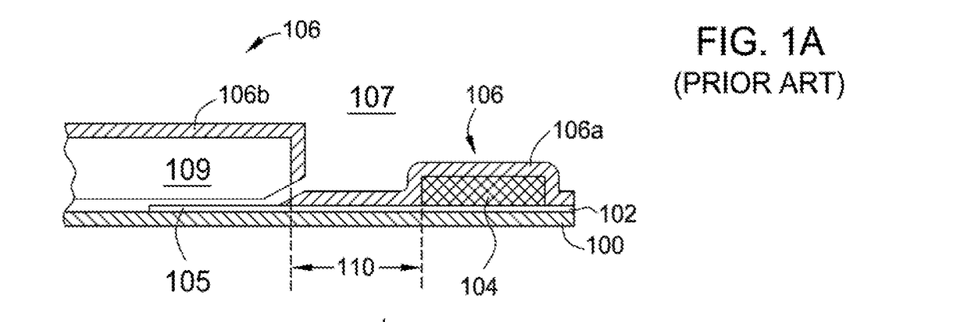
FIGS. 1A-1C illustrate schematic cross-sectional views of an OLED structure during different stages of a conventional encapsulation sequence known in the art.
Figure 1B:
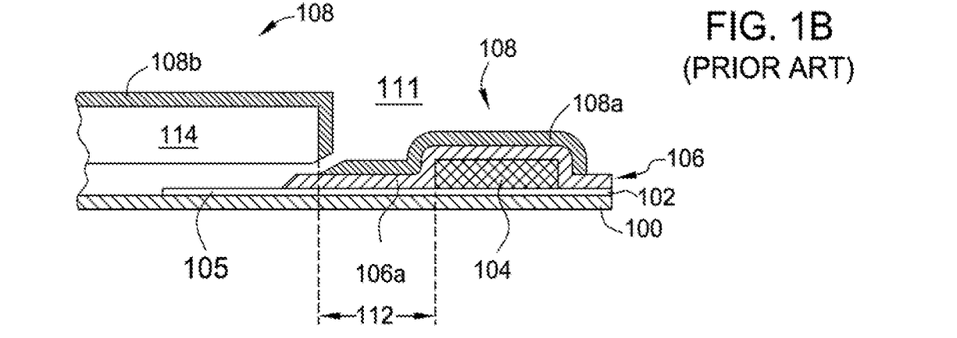
Figure 1C:
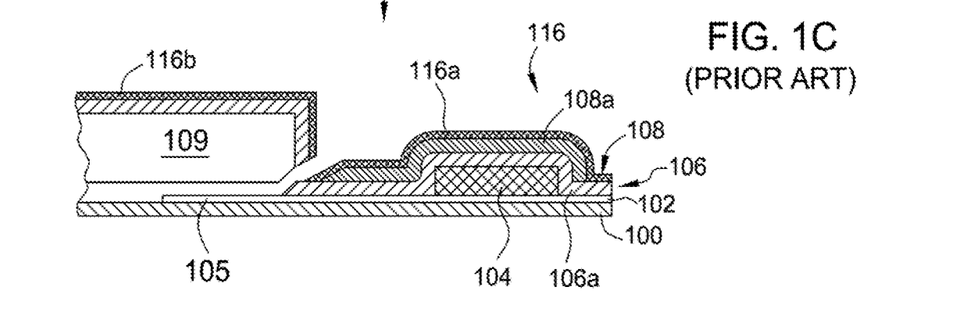

FIGS. 1A-C illustrate a conventional process for depositing the encapsulating layers, typically including a first inorganic layer 106 (shown as 106a and 106b), an organic layer 108 (shown as 108a and 108b) and a second inorganic layer 116 (shown as 116a and 116b). The process begins by aligning a first mask 109 over a substrate 100 such that an OLED structure 104 is exposed through an opening 107 unprotected by the mask 109, as shown in FIG. 1A. The first mask 109 defines the opening 107 having a distance 110 from the OLED structure 104 to the edge of the first mask 109. The first mask 109 is typically made from a metal material, such as INVAR®. As illustrated in FIG. 1A, the first mask 109 is utilized to pattern the first inorganic layer 106 (shown as 106a, 106b), such as silicon nitride or aluminum oxide, over the OLED structure 104. The first mask 109 is positioned such that a portion 105 of a contact layer 102 adjacent to the OLED structure 104 is covered by the first mask 109 so that the inorganic layer 106 does not deposit on that portion 105. As illustrated in FIG. 1B, the first mask 109 is removed and replaced by a second mask 114 having an opening 111 smaller than the opening 107 of the first mask 109. The second mask 114 defines the opening 111 having a distance 112, which is shorter than the distance 110 as defined by the first mask 109, from the OLED structure 104 to the edge of the second mask 114. By utilizing the second mask 114, an organic layer 108 (shown as 108a, 108b) is deposited over the first inorganic layer 106. As the second mask 114 has the opening 111 smaller than the first mask 109, the organic layer 108 does not completely cover the underlying inorganic layer 106. The encapsulation of the OLED structure 104 is finished by depositing at least a second inorganic layer 116 (shown as 116a and 116b) over the top of the exposed portion of the first inorganic layer 106 and the organic layer 108 utilizing the first mask 109 as illustrated in FIG. 1C. The second inorganic layer 116 fully encapsulates the organic layer 108 with the first inorganic layer 106, thereby encapsulating the OLED structure 104 while leaving the portion 105 of the contact layer 102 exposed.

The conventional process flow described above has significant challenges preventing commercially viable scaling for use with larger area substrates, such as substrates having a top plan area greater than about 1,500 centimeters square. For example, the two metal masks 109, 114 required for implementing the above described process for such large area substrates are very expensive, and may each exceed $40,000.00 in cost. Additionally, very tight alignment tolerance of each metal mask 109, 114 to the OLED structure 104 is required, generally within 100 µm. As these masks 109, 114 often exceed one meter in length, the masks 109, 114 undergo significant thermal expansion when heated from ambient temperatures to processing temperatures of about 80 degrees Celsius. This significant thermal expansion provides a major challenge for OLED fabricators as to how to prevent alignment loss between the openings 107, 111 formed through the masks 109, 114 and the OLED structure 104. Loss of alignment may result in incomplete encapsulation of the OLED structure 104, which in turn leads to shortened life and diminished performance of the OLED device 104.

Therefore, an improved method and apparatus for thin film encapsulation of an OLED structure is needed.

SUMMARY

In one embodiment of the present invention, a method for forming an encapsulating layer on an organic light emitting diode (OLED) substrate comprises forming a first inorganic layer on a region of a substrate having an OLED structure disposed thereon in a processing chamber, forming a hybrid inorganic/organic layer on the first inorganic layer in the processing chamber, and forming a second inorganic layer on the hybrid inorganic/organic layer in the processing chamber.

In another embodiment, a method for forming an encapsulating layer on an organic light emitting diode (OLED) substrate comprises forming a first inorganic layer on a region of a substrate having an OLED structure disposed thereon in a first processing chamber, transferring the substrate into a second processing chamber, forming a hybrid inorganic/organic layer on the first inorganic layer in the second processing chamber, transferring the substrate into the first processing chamber, and forming a second inorganic layer on the hybrid inorganic/organic layer in the first processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides methods and apparatus for thin film encapsulation of OLED structures disposed on a substrate using a hybrid layer of material. The encapsulation methods may be performed as single or multiple chamber processes. The processing parameters used during deposition of the hybrid layer of material allow control of the characteristics of the deposited hybrid layer. The hybrid layer may be deposited such that the layer has characteristics of an inorganic material in some sublayers of the hybrid layer and characteristics of an organic material in other sublayers of the hybrid layer. Use of the hybrid material allows OLED encapsulation using a single hard mask for the complete encapsulating process with low cost and without alignment issues present in conventional processes.

Figure 2:
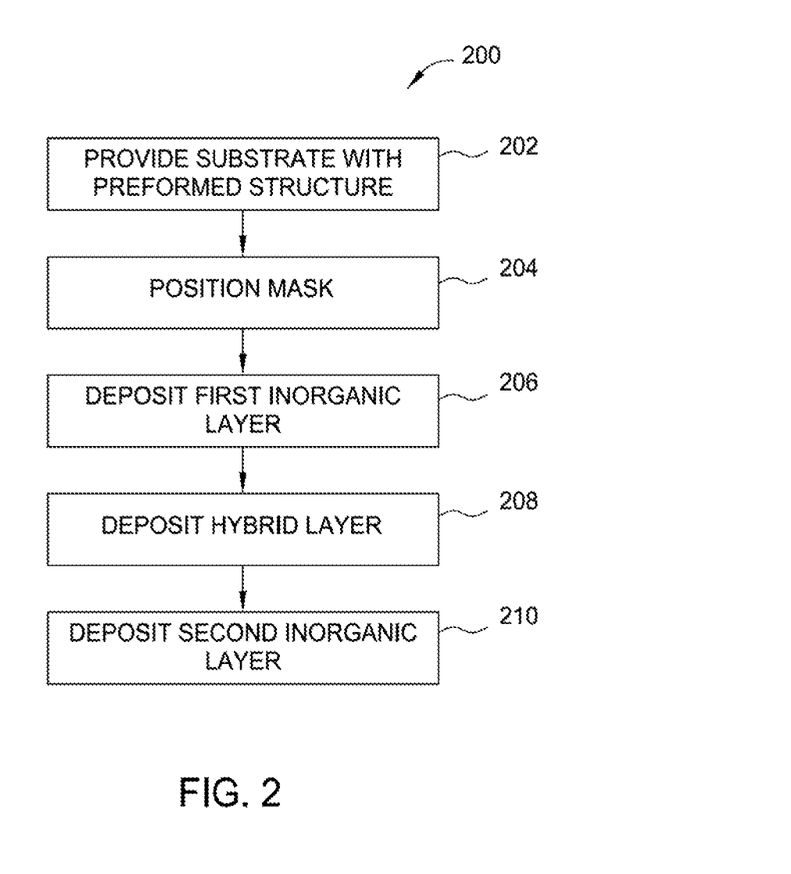
FIG. 2 is a flow diagram of a method for encapsulating an OLED structure in accordance with one embodiment of the present invention.
Figure 3A:
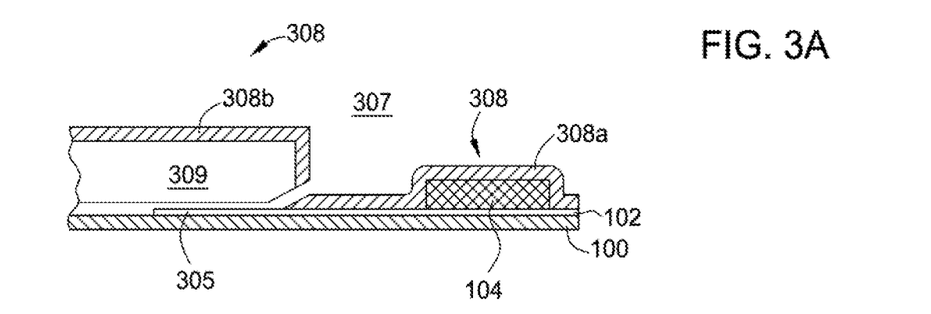
FIGS. 3A-3C illustrate schematic cross-sectional views of an OLED structure during different stages of the method of FIG. 2.
Figure 3B:
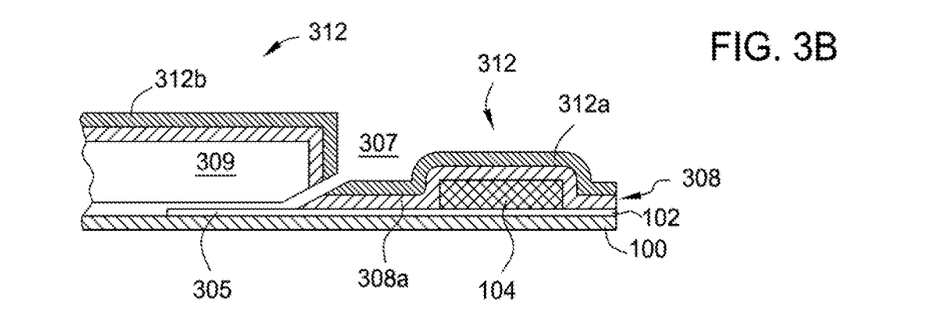
Figure 3C:
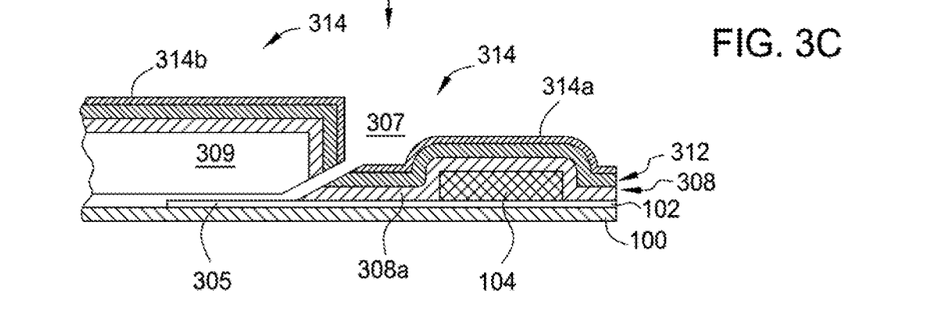

FIG. 2 is a flow diagram of a method 200 for thin film encapsulation of an OLED structure disposed on a substrate. FIGS. 3A-3C illustrate schematic cross-sectional views of an OLED structure during different stages of the encapsulation method 200 of FIG. 2. The method 200 starts at process 202 by providing a substrate 100 having a pre-formed OLED structure 104 disposed thereon. Similar to that discussed above, the substrate 100 may have a contact layer 102 disposed thereon, with an OLED structure 104 disposed on the contact layer 102, as shown in FIG. 3A.

At process 204, a mask 309 is aligned over the substrate 100 such that the OLED structure 104 is exposed through an opening 307 unprotected by the mask 309, as shown in FIG. 3A. The mask 309 is positioned such that a portion 305 of the contact layer 102 adjacent the OLED structure 104 is covered by the mask 309 so that any subsequently deposited material does not deposit on the portion 305. The mask 309 may be made from a metal material, such as INVAR®.

At process 206, a first inorganic layer 308 is deposited on the substrate 100, as shown in FIG. 3A. The first inorganic layer 308 has a first portion 308a and a second portion 308b. The first portion 308a of the first inorganic layer 308 is deposited through the opening 307 onto a region of the substrate 100 exposed by the mask 309, which includes the OLED structure 104 and a portion of the contact layer 102. The second portion 308b of the first inorganic layer 308 is deposited on the mask 309 covering a second region of the substrate 100, which includes the portion 305 of the contact layer 102. The first inorganic layer 308 is a dielectric layer, such as SiN, SiON, $SiO_2$, $Al_2O_3$, AlN, or other suitable dielectric layers. The first inorganic layer 308 may be deposited by a suitable deposition technique, such as CVD, PVD, spin-coating, or other suitable technique.

At process 208, after the first inorganic layer 308 is formed on the substrate 100, a hybrid layer 312 is then formed on the first inorganic layer 308 on the substrate 100, as shown in FIG. 3B. A first portion 312a of the hybrid layer 312 may be deposited on the substrate 100 through the opening 307 of the mask 309 on the region of the substrate 100 exposed by the mask 309, covering the first portion 308a of first the inorganic layer 308. A second portion 312b of the hybrid layer 312 is deposited on the second portion 308b of the first inorganic layer 308 disposed on the mask 309, which covers the portion 305 of the contact layer 102.

The hybrid layer 312 is a layer of material that is controlled through the deposition process, such as the flow ratio of gases, to be organic and have properties of organic materials, such as acrylate, methacrylate, acrylic acid, or the like, or be inorganic and have properties of inorganic materials, such as those used for the first inorganic layer 308 described above. When the hybrid material is in the inorganic state, it has inorganic material properties, such as density and porosity approximately the same as those of the listed inorganic materials. When the hybrid material is in the organic state, it has organic properties that may include characteristics of organic materials including stress relief, particle conformality, and flexibility approximately the same as those of the listed organic materials. Generally, a hybrid material in its "organic" state is more flexible and less dense than the hybrid material in its "inorganic" state. In addition, the hybrid material is generally flowable to provide good step coverage and gap fill of OLED structures.

An example of a material used in the hybrid layer 312 is plasma-polymerized hexamethyldisiloxane (pp-HMDSO). Deposition of the pp-HMDSO material layer is achieved by flowing an oxygen-containing gas and HMDSO gas. During deposition of the pp-HMDSO layer, the ratio of the flow of oxygen-containing gas to the flow of HMDSO gas is controlled to control the organic/inorganic state and properties of the resulting pp-HMDSO layer.

In one example, the oxygen-containing gas is oxygen gas ($O_2$). A high $O_2$/HMDSO flow ratio (e.g., greater than 10) may be maintained during processing to deposit an inorganic pp-HMDSO layer having characteristics, such as the high density and low porosity barrier properties associated with inorganic films. A low $O_2$/HMDSO flow ratio (e.g., less than 2) may be maintained during processing to deposit an organic pp-HMDSO layer having properties, such as the low stress properties associated with organic films.

Control of the oxygen gas used during deposition of the pp-HMDSO layer can minimize potential reaction with residual silane if present in the gas line or inlet of the deposition chamber. The reaction between the oxygen gas and residual silane can result in undesirable particle formation in the pp-HMDSO layer, which has the potential for contaminating the final OLED device. One method of minimizing the potential for reaction with silane is to perform a gas-line purge between deposition processes. Alternatively, other gases such as nitrous oxide, which are less reactive with silane relative to oxygen gas, may be used. It has been found that the use of nitrous oxide gas ($N_2O$) as the oxygen-containing gas results in minimal reaction with residual silane, thereby reducing, if not eliminating, the need to thoroughly purge the gas lines and chamber after use of silane within the chamber. Thus, a high-quality pp-HMDSO layer can be deposited without any intervening purge process between the inorganic layer deposition process 206 and the hybrid layer deposition process 208.

Therefore, in one example the oxygen-containing gas is nitrous oxide gas. A high $N_2O$/HMDSO flow ratio (e.g., greater than 10) may be maintained during processing to deposit a relatively inorganic pp-HMDSO layer having characteristics, such as the high density and low porosity barrier properties associated with inorganic films. A low $N_2O$/HMDSO flow ratio (e.g., less than 2) may be maintained during processing to deposit an organic pp-HMDSO layer having properties, such as the low stress properties associated with organic films.

In a further example, a combination of $O_2$ and $N_2O$ may be used as the oxygen obtaining gas. In this example, a high ($O_2+N_2O$)/HMDSO flow ratio (e.g., greater than 10) may be maintained during processing to deposit a relatively inorganic pp-HMDSO layer having characteristics, such as the high density and low porosity barrier properties associated with inorganic films. A low ($O_2+N_2O$)/HMDSO flow ratio (e.g., less than 2) may be maintained during processing to deposit an organic pp-HMDSO layer having properties, such as the low stress properties associated with organic films.

It has been found that inorganic pp-HMDSO provides an excellent moisture barrier due to its high density and low porosity, even though its water contact angle is low (e.g., below 50 degrees, such as 10 to 30 degrees). It has further been found that although such organic pp-HMDSO exhibits excellent flexibility and stress relieving characteristics like the organic materials listed above, the organic pp-HMDSO also has good moisture resistance due to its high water contact angle (e.g., greater than 50 degrees, such as 60 to 99 degrees). In one example, the organic pp-HMDSO has an FTIR of less than 20% of pp-HMDSO in a silicon dioxide network.

In an exemplary embodiment, the processing parameters of the pp-HMDSO layer may include an HMDSO flow rate between about 100 sccm and about 800 sccm, the power density may be between about 0.15 W/cm$^2$ and about 0.75 W/cm$^2$, the pressure may be between about 500 mTorr and about 2000 mTorr, and the spacing may be between about 500 to 1200 mils.

At process 210, a second inorganic layer 314 is formed on the substrate 100, covering the hybrid layer 312 and the first organic layer 308 formed on the OLED structure 104, as shown in FIG. 3C. The second inorganic layer 314 includes a first portion 314a deposited over the first portion 312a of the hybrid layer 312 and a second portion 314b deposited over the second portion 312b of the hybrid layer 312.

The second inorganic layer 314 may be a dielectric layer similar to the first inorganic layer 308. The second inorganic layer 314 is a dielectric layer such as SiN, SiON, $SiO_2$, or other suitable dielectric layers. The second inorganic layer 314 may be deposited by a suitable deposition technique, such as CVD, PVD, spin-coating, or other suitable technique.

The second inorganic layer 314 may be deposited on the substrate 100 using the same mask 309 utilized to deposit the first inorganic layer 308 and the hybrid layer 312. This is possible due to the ability to control the properties, such as hydrophobicity of the hybrid layer 312 to have both good barrier properties (i.e., inorganic state) and good stress relief properties (i.e., organic state). At the same time, the hybrid layer 312, in all regions may be maintained to have adequate hydrophobic properties to ensure good encapsulation of the OLED structure 104 (i.e., density/porosity or water contact angle). Thus, the mask 309 does not have to be changed or removed during the encapsulation sequence. In one embodiment, the thickness of the hybrid layer 312 is at least 3 μm.

In one embodiment, the deposition of the hybrid layer 312 is controlled such that deposition of a sublayer adjacent the first inorganic layer 308 and another sublayer adjacent the second inorganic layer 314 is controlled such that the hybrid material in those respective sublayers is inorganic, which enables good adhesion to the first and second inorganic layers 308, 314, respectively. In this embodiment, the hybrid layer 312 is controlled to have a central sublayer that is organic to provide good stress relief between the inorganic sublayers. For example, the deposition of the hybrid layer 312 onto the first inorganic layer 308 is controlled to be inorganic having properties closely matching that of the first inorganic layer (e.g., $O_2$/HMDSO, $N_2O$/HMDSO, or ($O_2+N_2O$)/HMDSO flow ratio greater than 10). Proceeding upward, the deposition is controlled to have a gradual gradient, wherein the material is increasingly organic (e.g., decreasing $O_2$/HMDSO, $N_2O$/HMDSO, or ($O_2+N_2O$)/HMDSO flow ratio to less than 2). Continuing upward, the deposition is controlled to have a gradual gradient, wherein the material is increasingly inorganic (e.g., increasing $O_2$/HMDSO, $N_2O$/HMDSO, or ($O_2+N_2O$)/HMDSO flow ratio) until the material is inorganic having properties closely matching that of the second inorganic layer (e.g., $O_2$/HMDSO, $N_2O$/HMDSO, or ($O_2+N_2O$)/HMDSO flow ratio greater than 10) are achieved. The deposition gradient may be controlled by analog mode (i.e., continuous modulation), digital mode (i.e., stepwise modulation), or alternating modulation.

In another embodiment, the deposition of the hybrid layer 312 is controlled such that deposition of a sublayer adjacent the first inorganic layer 308 is controlled such that the hybrid material in this sublayer is organic to provide good stress relief between the inorganic layer 308 and the second inorganic layer. Further, the deposition of a sublayer adjacent the second inorganic layer 314 is controlled such that the hybrid material in this sublayer is inorganic to enable good adhesion to the second inorganic layer 314. For example, the deposition of the hybrid layer 312 onto the first inorganic layer 308 is controlled to be organic and have properties of organic materials, such as acrylate, methacrylate, acrylic acid, or the like (e.g., $O_2$/HMDSO, $N_2O$/HMDSO, or ($O_2+N_2O$)/HMDSO flow ratio less than 2). Proceeding upward, the deposition is controlled to have a gradual gradient, wherein the material is increasingly inorganic (e.g., increasing $O_2$/HMDSO, $N_2O$/HMDSO, or ($O_2+N_2O$)/HMDSO flow ratio) until the material is inorganic having properties closely matching that of the second inorganic layer (e.g., $O_2$/HMDSO, $N_2O$/HMDSO, or ($O_2+N_2O$)/HMDSO flow ratio greater than 10). The deposition gradient may be controlled by analog mode (i.e., continuous modulation), digital mode (i.e., stepwise modulation), or alternating modulation.

In one embodiment, to enhance interfacial adhesion between the first inorganic layer 308 and the hybrid layer 312, a plasma treatment may be performed on the first inorganic layer 308 prior to depositing the hybrid layer 312. For example, after depositing the first inorganic layer 308, a combination of gases, such as one or more of nitrogen ($N_2$), hydrogen ($H_2$), ammonia ($NH_3$), helium (He), and argon (AR) gases, may be excited into a plasma and introduced to the surface of the first inorganic layer 308 prior to depositing the hybrid layer 312. In one embodiment, the first inorganic layer 308 may be treated with a plasma treatment using a mixture of $N_2$, $H_2$, and $NH_3$ gases. The plasma treatment may chemically alter the surface of the first inorganic layer 308 such that improved adhesion may be achieved with the subsequently deposited hybrid layer 312.

In addition, to enhance interfacial adhesion between the hybrid layer 312 and the second inorganic layer 314, a plasma treatment may be performed on the hybrid layer 312 prior to depositing the second inorganic layer 314. For example, after depositing the hybrid layer 312, a combination of gases, such as one or more of $N_2$, $H_2$, $NH_3$, He, and AR gases, may be excited into a plasma and introduced to the surface of the hybrid layer 312 prior to depositing the second inorganic layer. In one embodiment, a dual step plasma process may be performed on the hybrid layer 312. For example, after the hybrid layer 312 is deposited, the surface of the hybrid layer 312 is first treated with a plasma treatment using a mixture of HMDSO gas, He, and $N_2$. Subsequently, the hybrid layer 312 is treated with a plasma treatment using a mixture of $H_2$, $N_2$, and $NH_3$ prior to depositing the second inorganic layer 314. The plasma treatment may chemically alter the surface of the hybrid layer 312 such that improved adhesion may be achieved with the subsequently deposited second inorganic layer 314.

In one embodiment, to increase the integrity of the encapsulation layer stack, the stress of the individual layers may be controlled for a close match. For example, the stress in the first inorganic layer 308 and/or the second inorganic layer 314 may be closely controlled by controlling processing parameters in order to substantially match the low (e.g., near zero) stress in the hybrid layer 312. In one example, the stress in the first inorganic layer 308 and/or second inorganic layer 314 may be controlled by controlling processing parameters, such as power and pressure (e.g., low processing power and high processing pressure), to have a tensile stress between about 0 and about $1 \times 10^9$ dynes/$cm^2$ or a compressive stress. Controlling the stress of the inorganic layers 308, 314 to such low amounts creates a better match to the hybrid layer 312 resulting in less chance that the hybrid layer 312 will wrinkle or crack due to stress mismatch.

Figure 4:
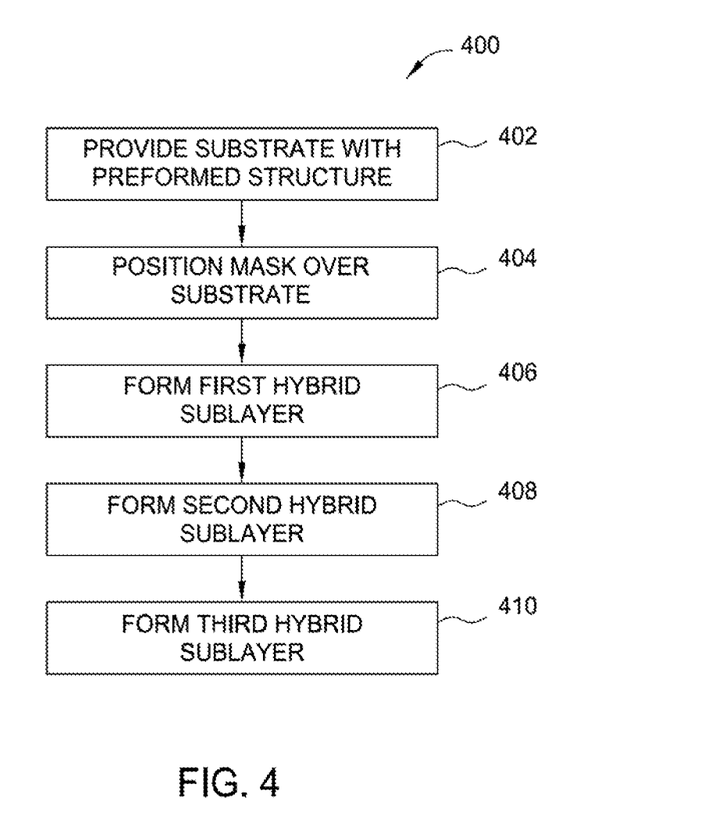
FIG. 4 is a flow diagram of a method for encapsulating an OLED structure in accordance with another embodiment of the present invention.
Figure 5A:
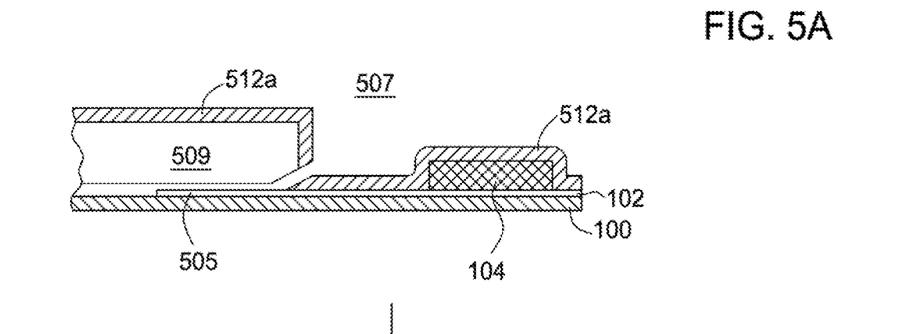
FIGS. 5A-5C illustrate schematic cross-sectional views of an OLED structure during different stages of the method of FIG. 4.
Figure 5B:
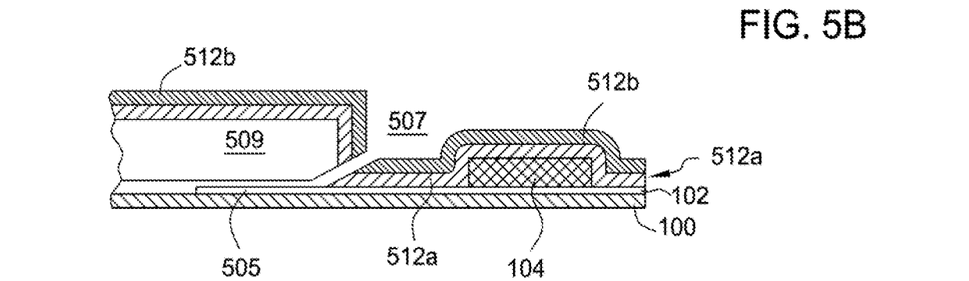
Figure 5C:
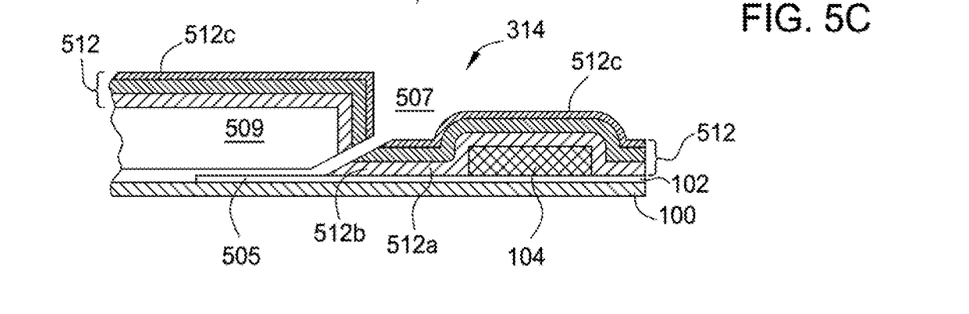

FIG. 4 is a flow diagram of a method 400 for thin film encapsulation of an OLED structure disposed on a substrate. FIGS. 5A-C illustrate schematic cross-sectional views of an OLED structure using the encapsulation method 400 of FIG. 4. The method 400 starts at process 402 by providing a substrate having a preformed OLED structure 104 disposed on a substrate 100. Similar to that discussed above, the substrate 100 may have a contact layer 102 disposed thereon, with an OLED structure 104 disposed on the contact layer 102, as shown in FIG. 5A.

At process 404, a mask 509 is aligned over the substrate 100 such that the OLED structure 104 is exposed through an opening 507 unprotected by the mask 509, as shown in FIG. 5A. The mask 509 is positioned such that a portion 505 of the contact layer 102 adjacent to the OLED structure 104 is covered by the mask 509 such that the any subsequently deposited material does not deposit on the portion 505. The mask 509 may be made from a metal material, such as INVAR®.

At processes 406-410, a hybrid layer 512 is deposited on the substrate 100, as shown in FIG. 5C. The hybrid layer 512 is deposited in sublayers 512a-c through the opening 507 onto a region of the substrate 100 exposed by the mask 509, which includes the OLED structure 104 and a portion of the contact layer 102. The hybrid layer 512 is also deposited on the mask 509 covering a second region of the substrate 100, which includes the portion 505 of the contact layer 102.

As previously described with respect to the hybrid layer 312, the hybrid layer 512 is a layer of flowable material that is controlled through the deposition process, such as the flow ratio of gases, to be organic and have properties of organic materials, such as acrylate, methacrylate, acrylic acid, or the like, or inorganic and have properties of inorganic materials, such as those used for the first inorganic layer 308 described above. An example of a material used in the hybrid layer 512 is plasma-polymerized hexamethyldisiloxane (pp-HMDSO). During deposition of the pp-HMDSO film, the ratio of oxygen-containing gas (e.g., $O_2$, $N_2O$, or $O_2+N_2O$) flow to HMDSO flow may be controlled to control the organic/inorganic properties of the resulting pp-HMDSO film sublayers.

In process 406, a first sublayer 512a of the hybrid layer 512 is deposited as shown in FIG. 5A. During deposition of the first sublayer 512a, the process parameters are controlled such that deposition of the first sublayer 512a is relatively inorganic having material properties matching those of the inorganic materials described above to provide good barrier properties to the hybrid layer 512. For example, the first sublayer 512a of the hybrid layer 512 may be deposited with a high $O_2$/HMDSO, $N_2O$/HMDSO, or ($O_2+N_2O$)/HMDSO flow ratio (e.g., greater than 10) to provide a pp-HMDSO layer with good barrier properties (e.g., high density, low porosity).

In process 408, a second sublayer 512b of the hybrid layer 512 is deposited as shown in FIG. 5B. During deposition of the second sublayer 512b, the process parameters are controlled such that deposition of the second sublayer 512b is organic having properties matching those of the organic materials described above to provide good stress relief between sublayers 512a and 512c. For example, the second sublayer 512b of the hybrid layer 512 may be deposited with a low $O_2$/HMDSO, $N_2O$/HMDSO, or ($O_2+N_2O$)/HMDSO flow ratio (e.g., less than 2) to provide a pp-HMDSO layer that is organic with organic properties and high water contact angle (e.g., greater than 50 degrees).

In process 410, a third sublayer 512c of the hybrid layer 512 is deposited as shown in FIG. 5C. During deposition of the third sublayer 512c, the process parameters are controlled such that deposition of the third sublayer 512c is inorganic and has properties matching those of the inorganic materials described above to provide good barrier properties to the hybrid layer 512. For example, the third sublayer 512c of the hybrid layer 512 may be deposited with a high $O_2$/HMDSO, $N_2O$/HMDSO, or ($O_2+N_2O$)/HMDSO flow ratio (e.g., greater than 10) to provide a relatively inorganic pp-HMDSO layer with good barrier properties and with a low contact angle (less than 50 degrees).

Although deposition of the hybrid layer 512 is depicted and described above in three distinct sublayers, the deposition of the hybrid layer may be controlled more smoothly to deposit the hybrid layer 512 in a single layer with a gradient starting as inorganic at the first sublayer 512a. The deposition parameters may then be gradually changed to provide a smooth (continuous or stepwise) gradient of material with increasingly organic properties (e.g., by decreasing the $O_2$/HMDSO, $N_2O$/HMDSO, or ($O_2+N_2O$)/HMDSO flow ratio) until the sublayer 512b is organic. Then, the deposition parameters may be gradually changed to provide a smooth (continuous or stepwise) gradient of material with increasingly that is increasing inorganic (e.g., by increasing the $O_2$/HMDSO, $N_2O$/HMDSO, or ($O_2$+$N_2O$)/HMDSO flow ratio) until the sublayer 512c is inorganic.

In an exemplary embodiment, the processing parameters of the pp-HMDSO layer may include an HMDSO flow rate between about 100 sccm and about 800 sccm, the power density may be between 0.15 W/cm$^2$ and about 0.75 W/cm$^2$, the pressure may be between about 500 mTorr and about 2000 mTorr, and the spacing may be between about 500 to 1200 mils.

Figure 6A:
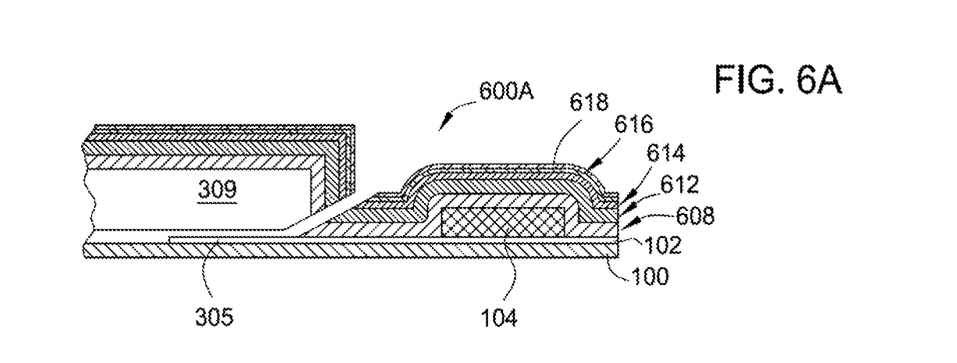
FIGS. 6A-6B illustrate schematic cross-sectional views of OLED encapsulation structures according to embodiments of the present invention.
Figure 6B:
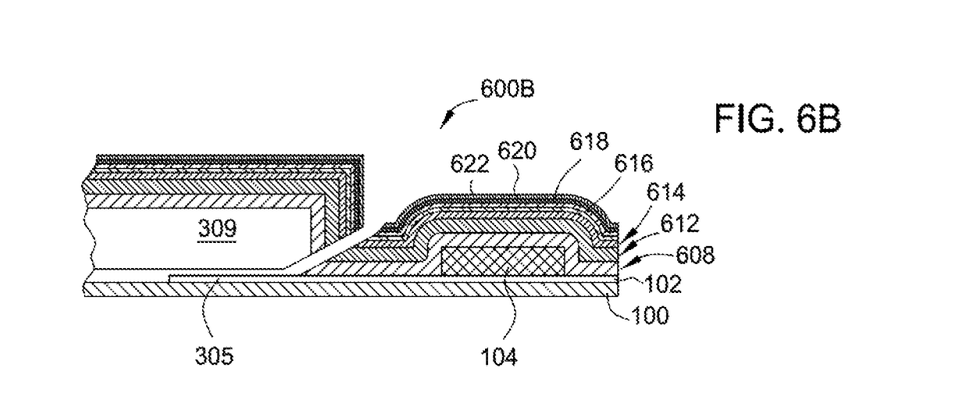

Referring back to FIG. 3C, although the thin film encapsulation layer stack depicted in FIG. 3C shows three layers (i.e., first inorganic layer 308, hybrid layer 312, and second inorganic layer 314), the encapsulation layer stack may include any number of alternating layers of inorganic/hybrid/inorganic material without departing from the scope of the present invention. As an example, FIG. 6A is a schematic, cross-sectional view of an OLED structure having an encapsulation layer stack 600A having five layers, i.e., a first inorganic layer 608, a first hybrid layer 612, a second inorganic layer 614, a second hybrid layer 616, and a third inorganic layer 618. As another example, FIG. 6B is a schematic, cross-sectional view of an OLED structure having an encapsulation layer stack 600B having seven layers, i.e., a first inorganic layer 608, a first hybrid layer 612, a second inorganic layer 614, a second hybrid layer 616, and a third inorganic layer 618, a third hybrid layer 620, and a fourth inorganic layer 622. Thus, any number of alternating layers of inorganic and hybrid layers, beginning and ending with an inorganic layer, may be used in forming an encapsulation layer stack in accordance with embodiments of the present invention.

In addition, the encapsulation layer stacks described herein may be deposited in a single deposition chamber (e.g., single plasma enhanced chemical vapor deposition (PECVD) chamber or microwave chemical vapor deposition (CVD)) or in two or more deposition chambers (e.g., two PECVD chambers or microwave CVD chambers). In the single chamber process, both the inorganic layers (e.g., 308, 314, 608, 614, 618, 622) and the hybrid layers (e.g., 312, 612, 616, 620) are deposited in a single chamber, such as the PECVD chamber described below.

In one example, a single chamber process may be used when the inorganic layers and hybrid layers comprise similar materials. For example, each of the inorganic layers may comprise SiN and be deposited using PECVD. Each of the hybrid layers may comprise pp-HMDSO and also be deposited using PECVD. Since the layers are deposited with similar processes and comprise similar materials, contamination risks are minimized, and all of the layers may be deposited in a single chamber. In addition, an in-situ clean process may be used in the single chamber process between cycles to further reduce the risk of contamination. The single chamber process may be advantageous in reducing cycle times as well as reducing the number of chambers (and equipment costs) of using a multiple chamber process.

In contrast, if different deposition techniques are used to deposit the inorganic and hybrid layers, or if the material compositions are dissimilar, a multiple chamber process may be used. In a multiple chamber process, the inorganic layers (e.g., 308, 314, 608, 614, 618, 622) are deposited in one chamber, such as the PECVD chamber described below, and the hybrid layers (e.g., 312, 612, 616, 620) are deposited in a different chamber, such as a different PECVD similar to the one described below. The multiple chamber process may be carried out such that all of the processes, including deposition and substrate transfer, are performed at vacuum in a multi-chamber processing system, such as the multi-chamber processing system described below with respect to FIG. 8.

Figure 7:
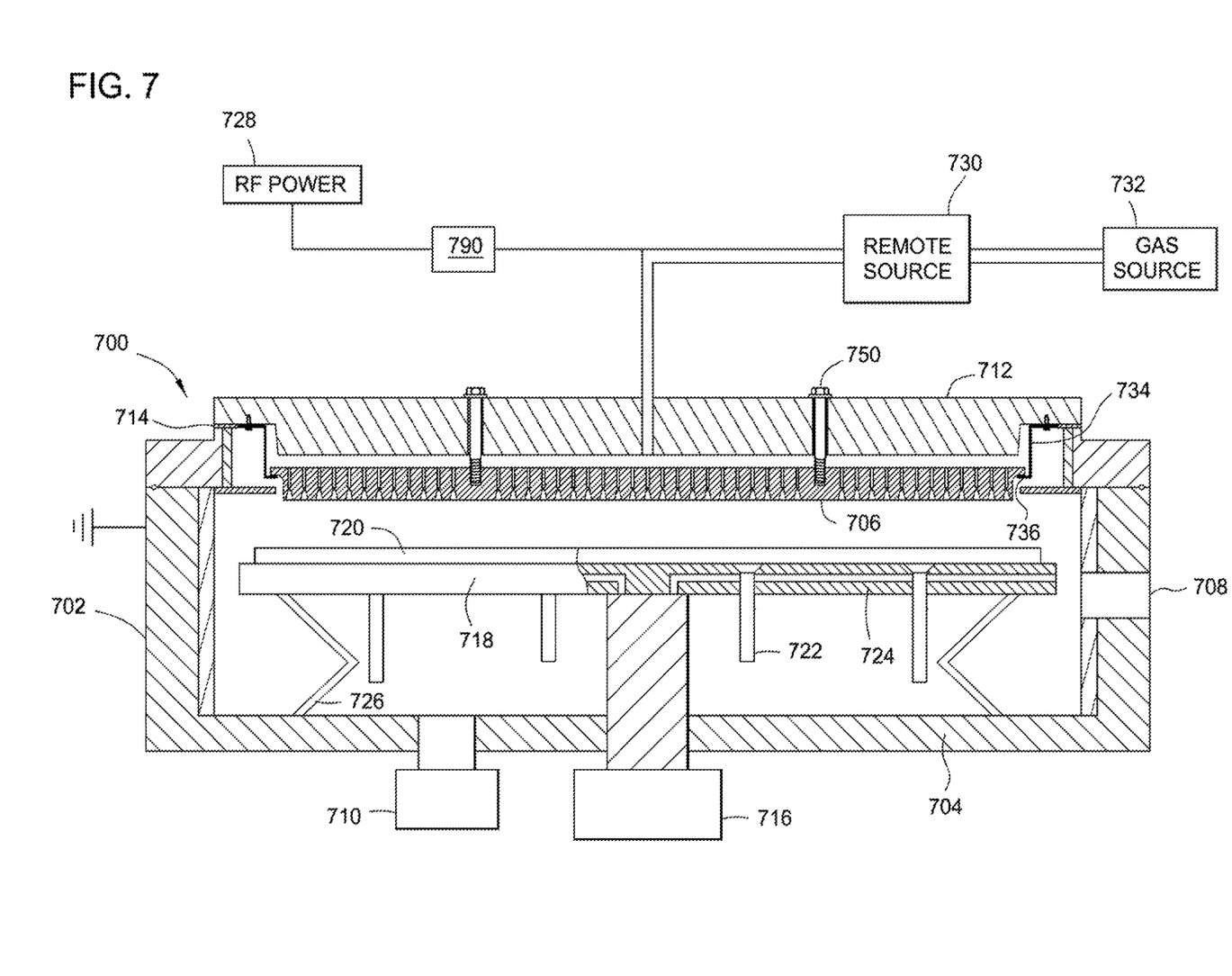
FIG. 7 is a schematic, cross sectional view of a PECVD apparatus that may be used to perform the operations described herein.

FIG. 7 is a schematic, cross sectional view of a PECVD apparatus that may be used to perform the operations described herein. For example, the PECVD apparatus may perform one or more of the deposition operations described with respect to FIGS. 2-6. The apparatus includes a chamber 700 in which one or more films may be deposited onto a substrate 720. The chamber 700 generally includes walls 702, a bottom 704 and a showerhead 706 which define a process volume. A substrate support 718 is disposed within the process volume. The process volume is accessed through a slit valve opening 708 such that the substrate 720 may be transferred in and out of the chamber 700. The substrate support 718 may be coupled to an actuator 716 to raise and lower the substrate support 718. Lift pins 722 are moveably disposed through the substrate support 718 to move a substrate to and from the substrate receiving surface. The substrate support 718 may also include heating and/or cooling elements 724 to maintain the substrate support 718 at a desired temperature. The substrate support 718 may also include RF return straps 726 to provide an RF return path at the periphery of the substrate support 718.

The showerhead 706 is coupled to a backing plate 712 by a fastening mechanism 750. The showerhead 706 may be coupled to the backing plate 712 by one or more fastening mechanisms 750 to help prevent sag and/or control the straightness/curvature of the showerhead 706.

A gas source 732 is coupled to the backing plate 712 to provide gas through gas passages in the showerhead 706 to a processing area between the showerhead 706 and the substrate 720. A vacuum pump 710 is coupled to the chamber 700 to control the process volume at a desired pressure. An RF source 728 is coupled through a match network 790 to the backing plate 712 and/or to the showerhead 706 to provide an RF current to the showerhead 706. The RF current creates an electric field between the showerhead 706 and the substrate support 718 so that a plasma may be generated from the gases between the showerhead 706 and the substrate support 718.

A remote plasma source 730, such as an inductively coupled remote plasma source 730, may also be coupled between the gas source 732 and the backing plate 712. Between processing substrates, a cleaning gas may be provided to the remote plasma source 730 so that a remote plasma is generated. The radicals from the remote plasma may be provided to chamber 700 to clean chamber 700 components. The cleaning gas may be further excited by the RF source 728 provided to the showerhead 706.

The showerhead 706 may additionally be coupled to the backing plate 712 by showerhead suspension 734. In one embodiment, the showerhead suspension 734 is a flexible metal skirt. The showerhead suspension 734 may have a lip 736 upon which the showerhead 706 may rest. The backing plate 712 may rest on an upper surface of a ledge 714 coupled with the chamber walls 702 to seal the chamber 700.

Figure 8:
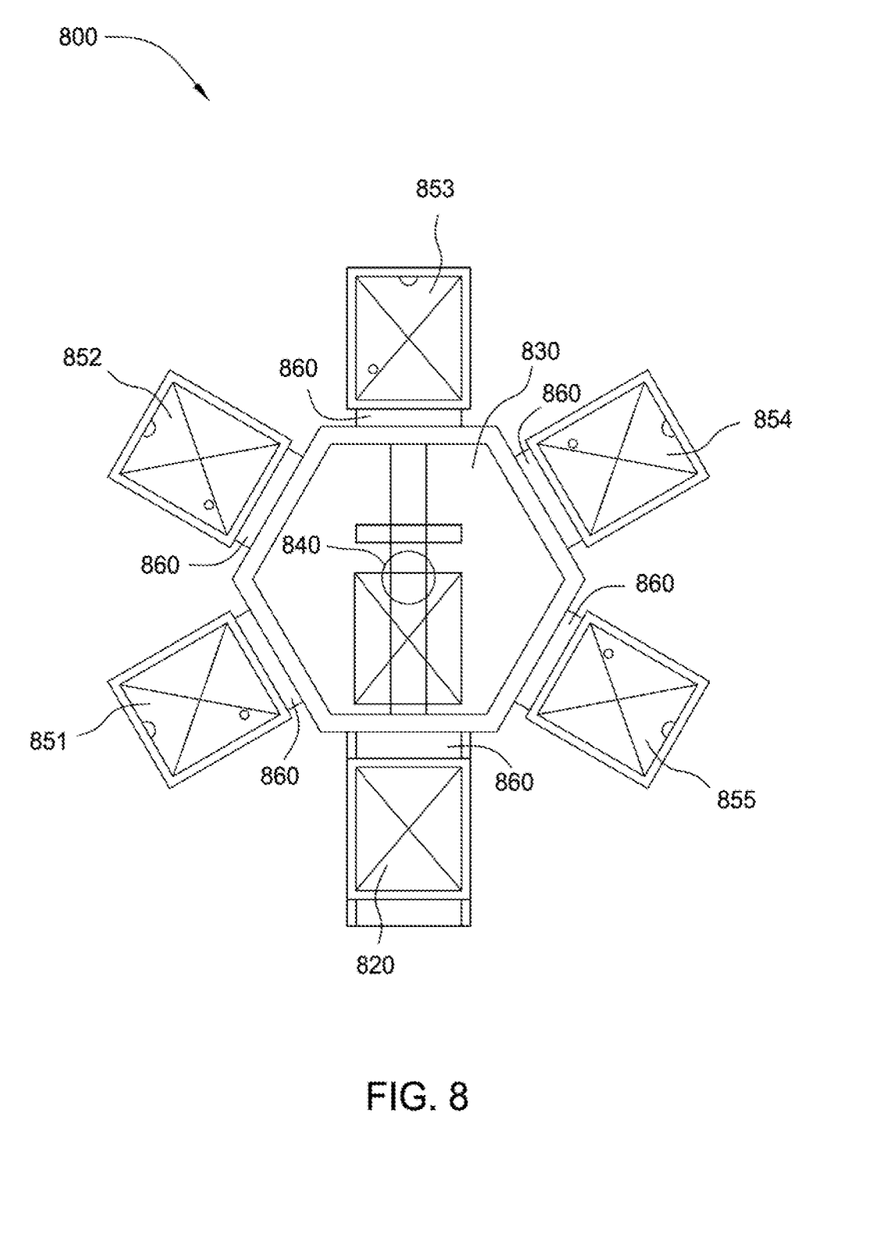
FIG. 8 is a schematic plan view of an exemplary substrate processing system that may be used to perform the operations described herein.

FIG. 8 is a schematic plan view of an exemplary substrate processing system 800 that may be used to perform the operations described herein. The substrate processing system 800 may include a load lock 820, a transfer chamber 830, a transfer robot 840, and multiple substrate processing chambers 851-855.

The load lock 820 allows the introduction of one or more substrates, such as the substrate 100, into the vacuum environment of the substrate processing system 800 without pressurizing the entire system to atmospheric pressure. The substrates are processed in the processing chambers 851-855. One or more of the processing chambers 851-855 may be the processing chamber 700 described above with respect to FIG. 7. The substrate processing chambers 851-855 may also include other types of processing chambers as well. Typically, the substrate processing chambers 851-855 are isolated from each other to minimize infiltration of incompatible process gases and because different processes may require significantly different levels of vacuum.

The transfer robot 840, inside the transfer chamber 830, transfers substrates between the substrate processing chambers 851-855 and the load lock 820. Each of the chambers 851-855 of the substrate processing system 800 may be isolated from all other chambers by one or more chamber isolation valves 860. These chamber isolation valves 860 are positioned between the transfer chamber 830 and the associated process chamber 851-855 or load lock chamber 820.

In operation, the processing system 800 may be used to provide separate processes described herein on one or more substrates while maintaining the substrates in a vacuum environment. For example, the encapsulation layer stacks described herein may be deposited in a single deposition chamber. In this embodiment, both the inorganic layers (e.g., 308, 314, 608, 614, 618, 622) and the hybrid layers (e.g., 312, 612, 616, 620) are deposited in a single chamber, such as a first processing chamber 851 in the processing system 800.

In another example, the first inorganic layers (e.g., 308, 608) may be deposited in the first chamber 851. The substrate 100 may then be transferred into a second chamber 852 through the transfer chamber 830 via the transfer robot 840. In the second chamber 852, the first hybrid layers (e.g., 312, 612) may be deposited. The substrate 100 may then be transferred back into the first chamber 851, or into a third chamber 853, where the second inorganic layers (e.g., 314, 614) may be deposited. If needed, the substrate 100 may then be transferred either back into the second chamber 852 or into a fourth chamber 854 for deposition of the second hybrid layer 616. The substrate 100 may then be transferred back into the first chamber 851, the third chamber 853, or a fifth chamber 855 for deposition of the third inorganic layer 618. If needed, the substrate 100 may then be transferred back into the second chamber 852 or the fourth chamber 854 for deposition of the third hybrid layer 620. Then, the substrate 100 may be transferred back into the first chamber 851, the third chamber 853, or the fifth chamber 855 for deposition of the fourth inorganic layer 622. Thus, the multiple chamber process may be carried out such that all of the processes, including deposition and substrate transfer, are performed at vacuum in the processing system 800.

Thus, methods and apparatus for forming encapsulation layers on an OLED structure are provided. By utilizing a hybrid layer during the encapsulation formation process, a single mask may be used, thereby advantageously lowering the manufacture cost as compared to the conventional two hard mask deposition processes while increasing the manufacture throughput. It should be noted that although the embodiments described herein depict a single stack of encapsulation layers/sublayers, multiple stacks of encapsulation layers/sublayers may be used without deviating from the scope of the invention.

While the foregoing is directed to embodiments of the present disclosure, other and further embodiments of the disclosure may be devised without departing from the basic scope thereof, and the scope thereof is determined by the claims that follow.

The invention claimed is:

1. A method for forming an encapsulating structure on an organic light emitting diode (OLED) substrate, comprising:
    forming a first inorganic layer on a region of a substrate, wherein the substrate has an OLED structure disposed thereon;
    forming a hybrid inorganic/organic gradient layer on the first inorganic layer in a processing chamber, wherein the hybrid inorganic/organic gradient layer comprises an inorganic sublayer and an organic sublayer, wherein the hybrid inorganic/organic gradient layer comprises plasma-polymerized hexamethyldisiloxane (pp-HMDSO), and wherein the inorganic sublayer is formed by providing a first flow ratio of a gas comprising nitrous oxide to HMDSO gas of about 10 or greater, and wherein the organic sublayer is formed by providing a second flow ratio of the gas comprising nitrous oxide to HMDSO gas of less than about 2, and
    forming a second inorganic layer on the hybrid inorganic/organic gradient layer in the processing chamber, wherein the first inorganic layer and the second inorganic layer are formed by providing the first flow ratio of the gas comprising nitrous oxide to hexamethyldisiloxane (HMDSO) and the hybrid inorganic/organic gradient layer is formed by providing the second flow ratio different from the first flow ratio of the gas comprising nitrous oxide to HMDSO.

2. The method of claim 1, further comprising plasma treating a surface of the first inorganic layer prior to forming the hybrid inorganic/organic gradient layer on the first inorganic layer.

3. The method of claim 1, further comprising plasma treating a surface of the hybrid inorganic/organic gradient layer prior to forming the second inorganic layer on the hybrid inorganic/organic gradient layer.

4. The method of claim 1, wherein the stress in the first inorganic layer is controlled to have a tensile stress between 0 and about $1\times10^9$ dynes/cm$^2$.

5. The method of claim 1, wherein the inorganic sublayer is predominantly inorganic adjacent the first inorganic layer.

6. The method of claim 5, wherein the organic sublayer is predominantly organic adjacent the second inorganic layer.

7. The method of claim 1, wherein a deposition gradient of the hybrid inorganic/organic gradient layer is controlled by stepwise modulation of the nitrous oxide to HMDSO ratio.

8. The method of claim 1, wherein a deposition gradient of the hybrid inorganic/organic gradient layer is controlled by continuous modulation of the nitrous oxide to HMDSO ratio.

9. The method of claim 1, further comprising:
    aligning a mask once prior to the forming processes, wherein the mask is present in each of the forming processes.

10. A method for forming an encapsulating structure on an organic light emitting diode (OLED) substrate, comprising:
    forming a first inorganic layer on a region of a substrate in a first processing chamber, wherein the substrate has an OLED structure disposed thereon;
    transferring the substrate into a second processing chamber;
    forming a hybrid inorganic/organic gradient layer on the first inorganic layer in the second processing chamber, wherein the hybrid inorganic/organic gradient layer comprises an inorganic sublayer and an organic sublayer, wherein the hybrid inorganic/organic gradient layer comprises plasma-polymerized hexamethyldisiloxane (pp-HMDSO), and wherein the inorganic sublayer is formed by providing a first flow ratio of a gas comprising nitrous oxide to HMDSO gas of about 10 or greater, and wherein the organic sublayer is formed by providing a second flow ratio of the gas comprising nitrous oxide to HMDSO gas of less than about 2;

transferring the substrate into the first processing chamber; and forming a second inorganic layer on the hybrid inorganic/organic gradient layer in the first processing chamber, wherein the first inorganic layer and the second inorganic layer are formed by providing the first flow ratio of the gas comprising nitrous oxide to hexamethyldisiloxane (HMDSO) and the hybrid inorganic/organic gradient layer is formed by providing the second flow ratio different from the first flow ratio of the gas comprising nitrous oxide to HMDSO.

11. The method of claim 10, wherein the inorganic sublayer is predominantly inorganic adjacent the first inorganic layer.

12. The method of claim 11, wherein the organic sublayer is predominantly organic adjacent the second inorganic layer.

13. The method of claim 10, wherein a deposition gradient of the hybrid inorganic/organic gradient layer is controlled by stepwise modulation of the nitrous oxide to HMDSO ratio.

14. The method of claim 10, wherein a deposition gradient of the hybrid inorganic/organic gradient layer is controlled by continuous modulation of the nitrous oxide to HMDSO ratio.

15. The method of claim 10, further comprising:
aligning a mask once prior to the forming processes, wherein the mask is present in each of the forming processes.

16. A method for forming an encapsulating structure on an organic light emitting diode (OLED) substrate, comprising:

forming a first inorganic layer on a region of the substrate having an OLED structure disposed thereon in a processing chamber, wherein the first inorganic layer is formed by providing a first flow ratio of a gas comprising nitrous oxide to hexamethyldisiloxane (HMDSO);

forming a hybrid inorganic/organic gradient layer comprising an inorganic sublayer and an organic sublayer on the first inorganic layer in the processing chamber by gradient deposition by providing a second flow ratio of the gas comprising nitrous oxide to HMDSO similar to the first flow ratio so that the inorganic sublayer of the hybrid inorganic/organic gradient layer is substantially inorganic, and subsequently providing a third flow ratio of the gas comprising nitrous oxide to HMDSO different than the second flow ratio so that the organic sublayer of the hybrid inorganic/organic gradient layer is increasingly organic; and forming a second inorganic layer on the hybrid inorganic/organic gradient layer in the processing chamber, wherein the second inorganic layer is formed by providing a fifth flow ratio of a gas comprising nitrous oxide to HMDSO similar to the first flow ratio.

* * * * *